United States Patent [19]
Barrow

[11] Patent Number: 5,917,702
[45] Date of Patent: Jun. 29, 1999

[54] CORNER HEAT SINK WHICH ENCLOSES AN INTEGRATED CIRCUIT OF A BALL GRID ARRAY INTEGRATED CIRCUIT PACKAGE

[75] Inventor: Michael Barrow, El Dorado Hills, Calif.

[73] Assignee: Intel Corporation, Santa Clara, Calif.

[21] Appl. No.: 08/978,915

[22] Filed: Nov. 26, 1997

[51] Int. Cl.[6] .................................................. H05K 7/20
[52] U.S. Cl. ..................... 361/704; 174/16.3; 257/707; 257/713; 361/720
[58] Field of Search .................................. 165/80.2, 80.3, 165/185; 174/16.3, 252, 260; 257/707, 712, 713, 719; 361/704, 707, 715–722

[56] References Cited

U.S. PATENT DOCUMENTS

| | | | |
|---|---|---|---|
| 4,855,867 | 8/1989 | Gazdik et al. | 361/719 |
| 5,510,956 | 4/1996 | Suzuki | 361/704 |

OTHER PUBLICATIONS

IBM Tech Disl. Bulletin, "Thermally Conductive Substrate Mounted Multi–Chip Module Cap", vol. 36, No. 09B, Sep. 1993, pp. 623–624. 361/704.

*Primary Examiner*—Gregory Thompson
*Attorney, Agent, or Firm*—Blakely, Sokoliff, Taylor & Zafman LLP

[57] ABSTRACT

An integrated circuit package. The package includes a substrate which has a first surface, a second opposite surface and a plurality of corners. A plurality of solder balls may be soldered to the second surface of the substrate. The solder balls can be reflowed to a printed circuit board. An integrated circuit is mounted to the first surface of the substrate. Each corner has a conductive plane located on the first surface of the substrate. The package includes a metal lid that is thermally coupled to the integrated circuit and attached to the conductive plane at the corner of the substrate. The lid encloses the integrated circuit and provides a thermal path from the integrated circuit to the conductive planes at the corners of the substrate. The thermal path allows heat generated by the integrated circuit to flow through the lid and into the printed circuit board.

9 Claims, 1 Drawing Sheet

CORNER HEAT SINK WHICH ENCLOSES AN INTEGRATED CIRCUIT OF A BALL GRID ARRAY INTEGRATED CIRCUIT PACKAGE

BACKGROUND OF THE INVENTION

1. FIELD OF THE INVENTION

The present invention relates to an integrated circuit package.

2. DESCRIPTION OF RELATED ART

Integrated circuits are typically assembled into a package that is mounted to a printed circuit board. There are a number of different types of integrated circuit packages including quad flat pack (QFP), pin grid array (PGA) and ball grid array (BGA) packages. BGA packages include a number of solder balls that are soldered to corresponding solder pads located on the bottom surface of a substrate. The solder balls are reflowed to attach the substrate to a printed circuit board.

An integrated circuit is mounted to a top surface of the substrate. The integrated circuit is coupled to bond pads located on the top surface of the substrate. The bond pads are connected to the solder pads by a number of vias and routing traces formed within the substrate. The integrated circuit is typically enclosed by a protective molded plastic material. The molding process increases the cost of the package. It would be desirable to eliminate the plastic housing while still covering the integrated circuit.

The heat generated by the integrated circuit conducts into the printed circuit board through the vias, the routing traces and the solder balls. The vias and routing traces have a relatively high thermal impedance. The high thermal impedance creates an undesirable temperature differential between the circuit board and the integrated circuit. The high temperature differential may create junction temperatures which exceed the recommended operating limits of the integrated circuit. Some packages incorporate heat slugs into the plastic housing to remove heat from the top surface of the integrated circuit die. Heat slugs add to the complexity and cost of mass producing the package. It would be desirable to provide an integrated circuit package that provides an alternate thermal path for heat to flow from the substrate to reduce the overall thermal impedance of the package.

SUMMARY OF THE INVENTION

An embodiment of the present invention is an integrated circuit package. The package includes a substrate which has a first surface, a second opposite surface and at least one corner. The corner has a conductive plane located on the first surface of the substrate. An integrated circuit is mounted to the first surface of the substrate. The package includes a lid that is thermally coupled to the integrated circuit and attached to the conductive plane at the corner of the substrate.

DETAILED DESCRIPTION OF THE INVENTION

One embodiment of the present invention is an integrated circuit package. The package includes a substrate which has a first surface, a second opposite surface and a plurality of corners. A plurality of solder balls may be soldered to the second surface of the substrate. The solder balls can be reflowed to a printed circuit board. An integrated circuit is mounted to the first surface of the substrate. Each corner has a conductive plane located on the first surface of the substrate. The package includes a metal lid that is thermally coupled to the integrated circuit and attached to the conductive plane at the corner of the substrate. The lid encloses the integrated circuit and provides a thermal path from the integrated circuit to the conductive planes at the corners of the substrate. The thermal path allows heat generated by the integrated circuit to flow through the lid and into the printed circuit board.

Figure 1:
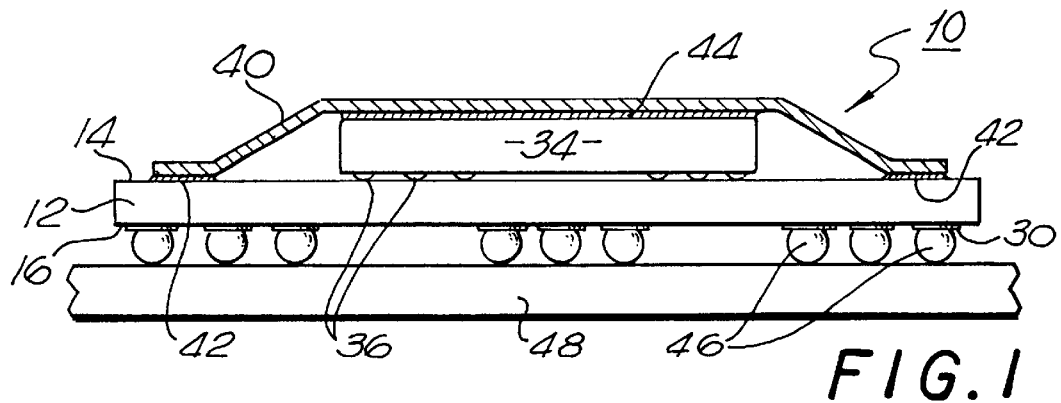
FIG. 1 is a cross-sectional view of an integrated circuit package of the present invention.
Figure 2:
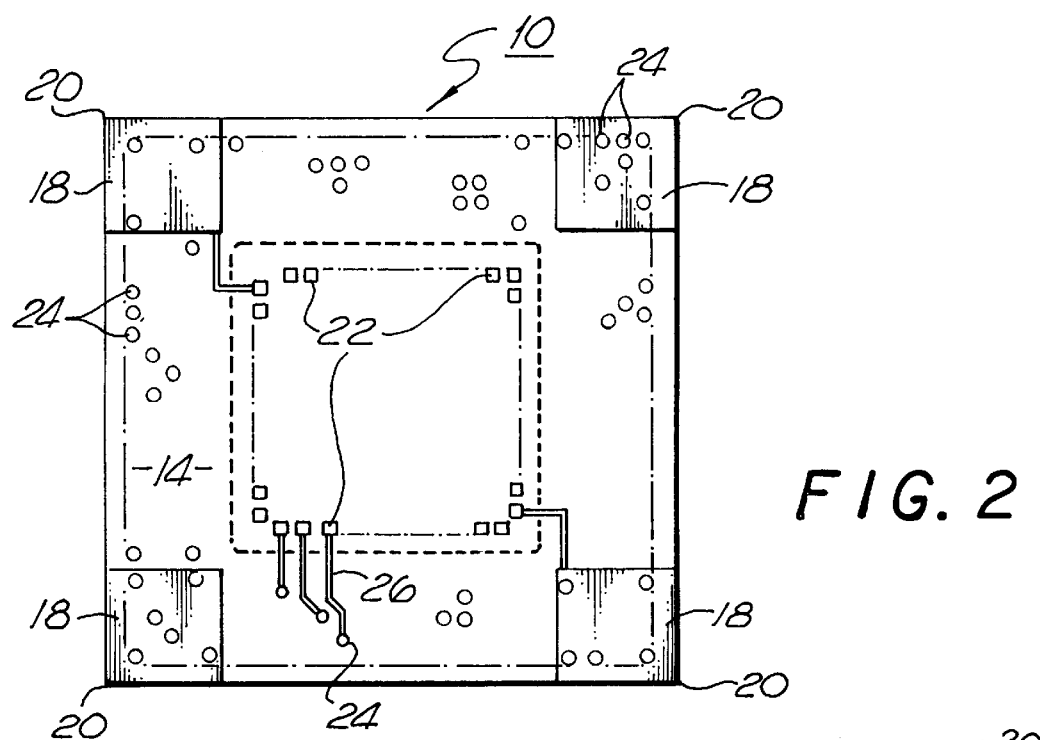
FIG. 2 is a top view of a substrate of the package.
Figure 3:
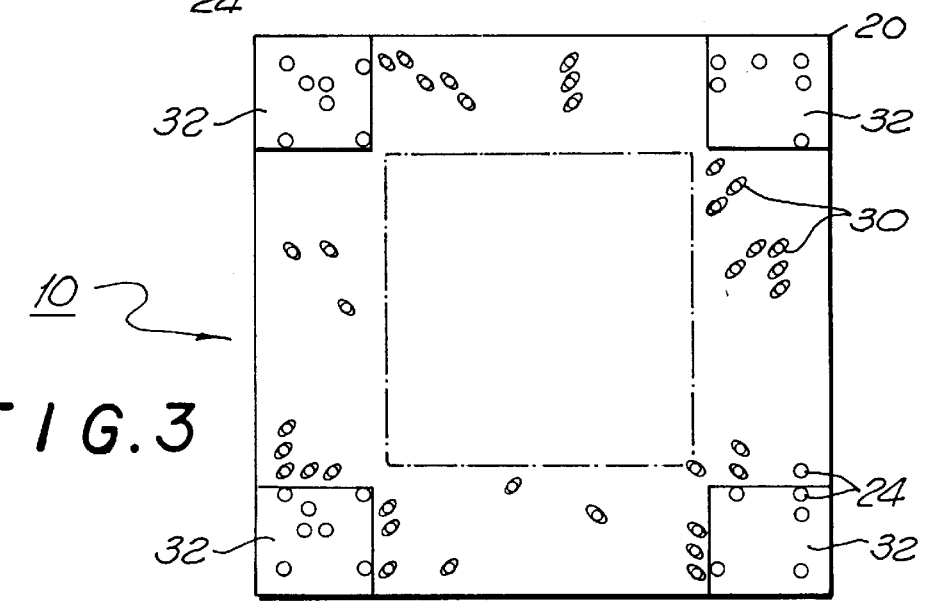
FIG. 3 is a bottom view of the substrate.

Referring to the drawings more particularly by reference numbers, FIGS. 1–3 show an integrated circuit package 10 of the present invention. The integrated circuit package 10 includes a substrate 12 which has a first surface 14 and an opposite second surface 16.

As shown in FIG. 2, the first surface 14 may have a number of conductive planes 18 at the four corners 20 of the substrate 12. The first surface 14 may have a plurality of bond pads 22. The bond pads 22 may be connected to vias 24 by routing traces 26. The vias 24 extend through the substrate 12 from the first surface 14 to the second surface 16. Some of the bond pads 22 may be connected to the conductive planes 18. The planes 18 may be dedicated to electrical power and/or ground. The conductive planes 18 may contain a number of vias 24 that extend through the substrate 12.

As shown in FIG. 3, the vias 24 are connected to a plurality of solder pads 30 located on the second surface 16 of the substrate 12. The solder pads 30 preferably have an elliptical shape to increase the peel strength of the pads 30. The second surface 16 also has a plurality of conductive planes 32 located at the four corners 20 of the substrate 12. The conductive planes 32 of the second surface 18 are electrically and thermally coupled to the conductive planes 18 of the first surface 14 by the vias 24.

Referring to FIG. 1, an integrated circuit 34 is mounted to the first surface 14 of the substrate 12. The integrated circuit 34 is connected to the bond pads 24 by a plurality of solder bumps 36. The integrated circuit 34 may be connected to the bond pads 24 by the solder bumps 36 in a process known as C4. The integrated circuit 34 may be a microprocessor, although it is to be understood that the circuit 34 may be any active or passive electrical device(s).

The integrated circuit 34 is enclosed by a thermally conductive lid 40. The conductive lid 40 may be attached to the conductive planes 18 at the four corners 20 of the substrate 12. The lid 40 may be attached to the planes 18 with a thermally conductive adhesive or epoxy 42. The lid 40 is also thermally coupled to the integrated circuit 34. The lid 40 can be pressed into the integrated circuit 34 to lower the thermal impedance between the two components. A thermal grease or epoxy 44 may be located between the lid 40 and the integrated circuit 34. Heat generated by the integrated circuit 34 may flow into the lid 40. From the lid 40 that heat can flow into the ambient and also into the substrate 12 through the conductive planes 32.

Contacts 46 are attached to the solder pads 30 located on the second surface 16 of the substrate 12. The contacts 46 may be attached to a printed circuit board 48. The contacts 46 are preferably solder balls that are initially attached to the solder pads 30 and then reflowed to attach the package 10 to the printed circuit board 48. The integrated circuit 34 is electrically connected to the printed circuit board 46 through the solder bumps 36, bond pads 22, vias 24, solder pads 30 and contacts 46. Although a ball grid array (BGA) type of package is shown and described, it is to be understood that other types of packages can be implemented with the present invention.

The package 10 can be assembled by mounting the integrated circuit 34 to the substrate 12. The lid 40 is then attached to the conductive planes 18 at the four corners of the substrate 12. The contacts 46 are attached to the solder pads 30. The package 10 is then mounted to the printed circuit board 48 by reflowing the contacts 46 onto the board 48.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art. For example, a heat sink may be coupled to the lid 40.

What is claimed is:

1. An integrated circuit package, comprising:

a substrate which has a first surface, an opposite second surface and a corner, said corner having a conductive plane on said first surface, said substrate further having a conductive plane that is located on said second surface of said substrate, and a via that couples said conductive planes of said first and second surfaces;

an integrated circuit that is mounted to said first surface of said substrate; and, a thermally conductive lid that is attached to said conductive plane at said corner of said substrate and thermally coupled to said integrated circuit.

2. The package as recited in claim 1, further comprising a thermal grease located between said thermally conductive lid and said integrated circuit.

3. The package as recited in claim 1, further comprising a solder ball that is attached to said second surface of said substrate.

4. An electronic package assembly, comprising:

a substrate which has a first surface, an opposite second surface and four corners, each corner having a conductive plane on said first surface and said second surface, and a via that extends through said substrate to connect said conductive planes of said first surface and said second surface;

an integrated circuit that is mounted to said first surface of said substrate; and, a thermally conductive lid that is attached to said conductive planes at said corners of said substrate and thermally coupled to said integrated circuit;

a contact that is coupled to said via on said second surface of said substrate; and, printed circuit board that is attached to said contact.

5. The assembly as recited in claim 4, further comprising a thermal grease located between said thermally conductive lid and said integrated circuit.

6. The assembly as recited in claim 4, wherein said contact is a solder ball.

7. A method for assembling an integrated circuit package, comprising the steps of:

a) providing a substrate which has a first surface, an opposite second surface and four corners, each corner having a conductive plane on said first surface, a conductive plane on said second surface, and a via that couples said conductive planes of said first and second surfaces;

b) mounting an integrated circuit to said first surface of said substrate; and, c) attaching a thermally conductive lid to said conductive planes at said four corners of said substrate such that said thermally conductive lid is thermally coupled to said integrated circuit.

8. The method as recited in claim 7, further comprising the step of attaching a contact to said second surface of said substrate.

9. The method as recited in claim 8, further comprising the step of attaching a printed circuit board to said contact.

* * * * *